US012747334B2

(12) United States Patent
Mwasame et al.

(10) Patent No.: US 12,747,334 B2
(45) Date of Patent: Sep. 29, 2026

(54) POLYOLEFIN FORMULATION CONTAINING COMBINATION OF VOLTAGE STABILIZER COMPOUNDS

(71) Applicants: Dow Global Technologies LLC, Midland, MI (US); Rohm and Haas Company, Collegeville, PA (US)

(72) Inventors: Paul M. Mwasame, Royersford, PA (US); Xindi Yu, Paoli, PA (US); Decai Yu, Midland, MI (US); Sukrit Mukhopadhyay, Midland, MI (US); Yuanqiao Rao, Berwyn, PA (US); Jeffrey M. Cogen, Flemington, NJ (US); Timothy J. Person, Pottstown, PA (US)

(73) Assignees: Dow Global Technologies LLC, Midland, MI (US); Rohm and Haas Company, Midland, MI (US)

( * ) Notice: Subject to any disclaimer, the term of this patent is extended or adjusted under 35 U.S.C. 154(b) by 405 days.

(21) Appl. No.: 18/560,973

(22) PCT Filed: Aug. 1, 2022

(86) PCT No.: PCT/US2022/039004
§ 371 (c)(1),
(2) Date: Nov. 15, 2023

(87) PCT Pub. No.: WO2023/014631
PCT Pub. Date: Feb. 9, 2023

(65) Prior Publication Data
US 2024/0417541 A1 Dec. 19, 2024

Related U.S. Application Data

(60) Provisional application No. 63/229,331, filed on Aug. 4, 2021.

(51) Int. Cl.

| | |
|---|---|
| ***C08K 5/13*** | (2006.01) |
| ***C08J 3/20*** | (2006.01) |
| ***C08J 3/24*** | (2006.01) |
| ***C08K 5/07*** | (2006.01) |
| ***G01R 31/12*** | (2020.01) |
| ***G01R 31/16*** | (2006.01) |
| ***H01B 3/30*** | (2006.01) |

(52) U.S. Cl.
CPC ................ *C08K 5/13* (2013.01); *C08J 3/201* (2013.01); *C08J 3/203* (2013.01); *C08J 3/24* (2013.01); *C08K 5/07* (2013.01); *H01B 3/307* (2013.01); *G01R 31/1272* (2013.01); *G01R 31/16* (2013.01)

(58) Field of Classification Search
CPC ... C08J 3/201; C08J 3/203; C08J 3/24; C08K 5/07; C08K 5/13; C08L 23/00; C08L 23/06; C08L 23/08; C08L 23/12; C08L 23/16; G01R 31/1272; G01R 31/16; H01B 3/28; H01B 3/307; H01B 3/441
See application file for complete search history.

(56) References Cited

U.S. PATENT DOCUMENTS

| | | | |
|---|---|---|---|
| 2,434,662 A | 1/1948 | Latham et al. | |
| 3,413,263 A | 11/1968 | Strobel et al. | |
| 3,629,110 A | 12/1971 | Hunt | |
| 4,018,852 A | 4/1977 | Schober | |
| 5,246,783 A | 9/1993 | Spenadel et al. | |
| 5,346,961 A | 9/1994 | Shaw et al. | |
| 6,496,629 B2 | 12/2002 | Ma et al. | |
| 6,696,154 B2 | 2/2004 | Martinotto et al. | |
| 6,714,707 B2 | 3/2004 | Rossi et al. | |
| 8,680,399 B2 | 3/2014 | Eaton | |
| 9,133,320 B2 | 9/2015 | Englund et al. | |
| 9,343,198 B2 | 5/2016 | Hjertberg et al. | |
| 10,390,318 B2 | 8/2019 | Löwenmark et al. | |
| 10,490,318 B2 | 11/2019 | Srivastava et al. | |
| 2002/0164480 A1* | 11/2002 | Martinotto | C08K 5/132 428/375 |
| 2010/0036031 A1* | 2/2010 | Herbst | H01B 7/2813 524/331 |
| 2016/0304699 A1 | 10/2016 | Jarvid et al. | |
| 2016/0312007 A1 | 10/2016 | Wutzel et al. | |

FOREIGN PATENT DOCUMENTS

| | | |
|---|---|---|
| CN | 106833358 | 3/2019 |
| DE | 2709139 | 9/1978 |
| EP | 0111043 | 6/1984 |
| EP | 2886595 | 6/2015 |
| GB | 1461331 | 1/1977 |

(Continued)

OTHER PUBLICATIONS

Wagner, "About the Significance of Peroxide Decomposition Products in XLPE Cable Insulations", IEEE Trans. Electr. Insul, 1977, p. 395-401, vol. E1-12, No. 6.

(Continued)

*Primary Examiner* — Ana L. Woodward

(57) ABSTRACT

A polyolefin formulation comprising (A) a polyolefin polymer: x weight percent (wt %) of (B) an alkoxyphenol compound of formula (I); and y wt % of (C) a benzophenone compound of formula (II) as described in the specification: wherein y is from 1 to 8 wt %; wherein x is from 0.1 to 3.0 wt %, with the proviso that x is less than 0.5y; and wherein wt % are based on total weight of the polyolefin formulation. Also crosslinked products made therefrom; methods of making and using same; and articles containing same.

12 Claims, 1 Drawing Sheet

(56) References Cited

FOREIGN PATENT DOCUMENTS

| | | |
|---|---|---|
| TW | 202019651 | 6/2020 |
| WO | 2010028721 | 3/2010 |
| WO | 2012044521 | 4/2012 |
| WO | 2014172107 | 10/2014 |
| WO | 2014209661 | 12/2014 |
| WO | 2020040249 | 2/2020 |
| WO | 2022093682 | 5/2022 |

OTHER PUBLICATIONS

International Search Report and Written Opinion from corresponding International Application No. PCT/US2022/039004 dated Nov. 22, 2022.
Office Action from corresponding Taiwan application No. 111128742 dated Dec. 15, 2025.

* cited by examiner

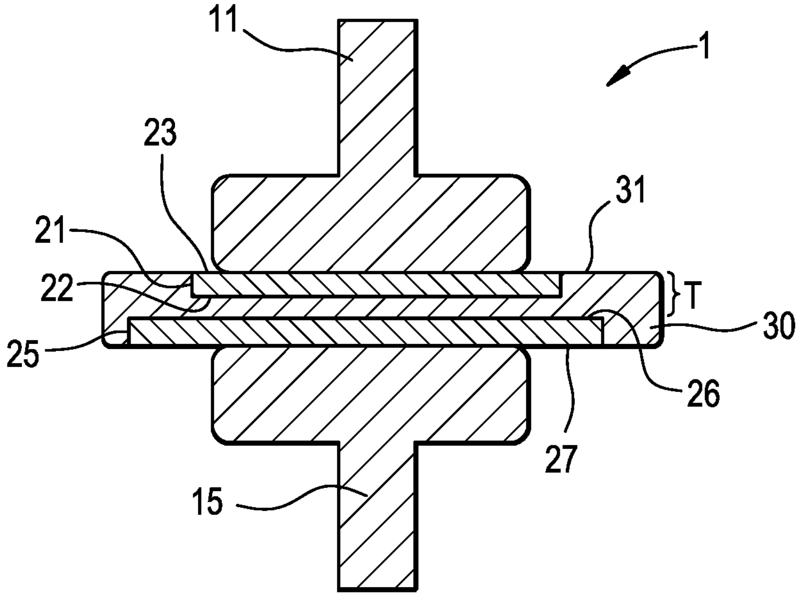
11
1
23
31
21
22
T
25
30
26
27
15

POLYOLEFIN FORMULATION CONTAINING COMBINATION OF VOLTAGE STABILIZER COMPOUNDS

The technical field includes polyolefin formulations for wires and cables.

INTRODUCTION

Patents in the field include U.S. Pat. Nos. 3,413,263, 6,696,154B2, 8,680,399B2, 9,133,320B2, and U.S. Pat. No. 9,343,198B2. Patent application publications in the field include EP0111043A1, EP2886595, GB1461331A, US20160304699A1, US20160312007A1, WO2010028721A1, WO2012044521, WO2014209661A1, and WO2014172107A1. Publications include *About The Significance Of Peroxide Decomposition Products In XLPE Cable Insulations,* by H. Wagner and J. Wartusch, IEEE Trans. Electr. Insul, vol. El-12, no. 6, December 1977.

Insulated electrical conductors typically comprise a conductive core covered by an insulation layer. The conductive core may be solid or stranded (e.g., a bundle of wires). Some insulated electrical conductors may also contain one or more additional elements such as semiconducting layer(s) and/or a protective jacket (e.g., wound wire, tape, or sheath). Examples are coated metal wires and electrical power cables, including those for use in low voltage ("LV", >0 to <5 kilovolts (kV)), medium voltage ("MV", 5 to <69 kV), high voltage ("HV", 69 to 230 kV) and extra-high voltage ("EHV", >230 kV) power cables and their electricity-transmitting/distributing applications. Evaluations of power cables may use AEIC/ICEA specifications and standards and/or IEC test methods.

A majority of high and extra-high voltage power cables contain an insulation layer composed of an insulation material that comprises a host polymer and one or more additives. The additive(s) may include antioxidants, a colorant, and/or a hindered amine stabilizer. Electrical breakdown strength (also known as dielectric strength) of the insulation material determines how thick the insulation layer needs to be to satisfy industry specifications for performance of power cables at a particular voltage.

All other things being equal, an insulation material having a higher electrical breakdown strength allows for a thinner insulation layer with the same electrical breakdown strength as a comparative thicker layer. All other things being equal, the thinner insulation layer means a thinner cable. The thinner cable beneficially allows using a lesser amount of cable mass per unit cable length for achieving a given electrical breakdown strength. In turn this helpfully increases the length of cable that can be wound onto a standard-size cable roll. The longer cables in turn decrease the number of joints or splices needed to connect two or more thinner cables together. Alternatively, the insulation material having a higher electrical breakdown strength allows for an insulation layer with the same thickness, and thus a cable of same thickness, but greater electrical breakdown strength. The same thickness cable having higher electrical breakdown strength advantageously allows higher voltage to be carried in that cable geometry. Transmitting electrical power at higher voltage reduces energy loss.

SUMMARY

We have discovered a voltage stabilizer additive combination comprising an alkoxyphenol compound and a benzophenone compound with beneficial voltage stabilizing efficacy. The efficacy is believed to be synergistic as described later. When a host polyolefin polymer is formulated with these compounds, the resulting polyolefin formulation has increased electrical breakdown strength versus that of host polyolefin without the (B) alkoxyphenol compound and the (C) benzophenone compound. In some embodiments the electrical breakdown strength of the inventive formulation is advantageously greater than that of a comparative formulation containing benzil and/or a benzil derivative. We contemplate the following embodiments.

A polyolefin formulation comprising (A) a polyolefin polymer; (B) an alkoxyphenol compound of formula (I):

(I)

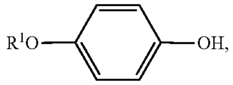

wherein $R^1$ is a $(C_1\text{-}C_{20})$alkyl; and (C) a benzophenone compound of formula (II):

(II)

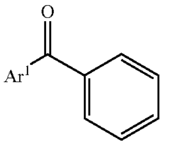

wherein $Ar^1$ is phenyl or an alkylphenyl.

A method of making the polyolefin formulation, the method comprising contacting the (A) polyolefin polymer with the (B) alkoxyphenol compound and the (C) benzophenone compound in such a way so as to make the formulation.

A method of making a crosslinked polyolefin product, the method comprising subjecting the formulation to a curing condition in such a way so as to crosslink the (A) polyolefin polymer, thereby making the crosslinked polyolefin product.

A crosslinked polyolefin product made by the above method.

An article comprising the polyolefin formulation and/or the crosslinked polymer product.

BRIEF DESCRIPTION OF THE DRAWING(S)

FIG. 1 is a drawing of a geometry of a test sample for measuring electrical breakdown strength.

DETAILED DESCRIPTION

The Summary and Abstract are incorporated here by reference. Embodiments follow, some of which are described as numbered aspects for easy reference.

Aspect 1. A polyolefin formulation comprising (A) a polyolefin polymer; x weight percent (wt %) of (B) an alkoxyphenol compound of formula (I):

(I)

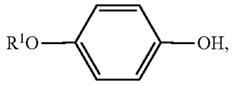

wherein $R^1$ is a $(C_1\text{-}C_{20})$alkyl; and y wt % of (C) a benzophenone compound of formula (II):

(II)

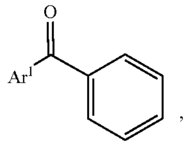

wherein $Ar^1$ is phenyl or an alkylphenyl; wherein y is from 1 to 8wt %; wherein x is from 0.1 to 3.0 wt %, with the proviso that x is less than 0.5y; and wherein wt % are based on total weight of the polyolefin formulation. The formulation may contain one and only one (B) alkoxyphenol compound and one and only one (C) benzophenone compound. The polyolefin formulation has increased electrical breakdown strength versus that of a (A) polyolefin polymer that is free of one or both of the constituents (B) and (C).

Aspect 2. The polyolefin formulation of aspect 1 wherein the $Ar^1$ is phenyl; and $R^1$ is selected from the group consisting of: (i) $(C_1\text{-}C_5)$alkyl; (ii) $(C_6\text{-}C_{10})$alkyl; (iii) methyl; and (iv) heptyl; or wherein the $Ar^1$ is an alkylphenyl; and $R^1$ is selected from the group consisting of: (i) $(C_1\text{-}C_5)$alkyl; (ii) $(C_6\text{-}C_{10})$alkyl; (iii) methyl; and (iv) heptyl. In other embodiments $R^1$ is selected from the group consisting of: (v) $(C_2\text{-}C_8)$alkyl; $(C_4\text{-}C_8)$alkyl; and (viii) $(C_6\text{-}C_8)$alkyl.

Aspect 3. The polyolefin formulation of any one of aspects 1 to 2 wherein the $R^1$ is methyl or heptyl and the $Ar^1$ is phenyl.

Aspect 4. The polyolefin formulation of any one of aspects 1 to 3 wherein the (A) polyolefin polymer is selected from the group consisting of: a low-density polyethylene polymer, an ethylene/$(C_4\text{-}C_{20})$alpha-olefin copolymer, an ethylene/(unsaturated carboxylic ester) copolymer, an ethylene/(monocyclic organosiloxane) copolymer, an ethylene/propylene copolymer, an ethylene/propylene/(diene monomer) terpolymer, and a propylene homopolymer.

Aspect 5. The polyolefin formulation of any one of aspects 1 to 4 comprising from 50.0 to 99.7 weight percent (wt %) of the (A) polyolefin polymer; from x=0.3 wt % to x=0.9 wt % of the (B) alkoxyphenol compound; from 1.9 to 7.4 wt % of the (C) benzophenone compound; and a total of from 0.1 to 43 wt % of at least one additive, wherein each of the at least one additive is different than constituents (A), (B), and (C) and is independently selected from the group consisting of: (D) an organic peroxide; (E) an anti-scorch agent; (F) an antioxidant; (G) a filler; (H) a flame retardant; (I) a hindered amine stabilizer; (J) a tree retardant; (K) a methyl radical scavenger; (L) a crosslinking coagent; (M) a processing aid; (N) a colorant; and a combination of any two or more of additives (D) to (N).

Aspect 6. The polyolefin formulation of aspect 5 comprising from 85 to 99.5 weight percent (wt %) of the (A) polyolefin polymer, which is a low-density polyethylene polymer; from 0.30 to 0.50 wt % of the (B) alkoxyphenol compound that is a compound of formula (I) wherein $R^1$ is methyl or heptyl; from 1.5 to 2.4 wt % of the (C) benzophenone compound of formula (II) wherein $Ar^1$ is phenyl; and from 0.1 to 1.5 wt % of at least one (F) antioxidant.

Aspect 7. A method of making the polyolefin formulation of any one of aspects 1 to 6, the method comprising mixing the (A) polyolefin polymer with the (B) alkoxyphenol compound and the (C) benzophenone compound, and, optionally, at least one additive, in such a way so as to make the formulation. The made formulation may be a non-uniform or uniform blend of constituents (A), (B), and (C). The contacting step comprises bringing constituents (A), (B), and (C) into contact with each other (from before they were previously not in contact). The contacting step may further comprise mixing the contacted (A), (B), and (C) together to form the uniform mixture thereof. In some embodiments the method further comprises mixing at least one of the optional additives (D) to (N) with (A) and (B). The mixing may comprise melt blending constituents (B), (C), and optionally one or more of additives (D) to (N) into a melt of constituent (A). The melt blending may be performed in an extruder configured for melting mixing polyolefins and additives. The resulting melt blend may be extruded through a die in to form a strand that is then pelletized to give the polyolefin formulation in the form of pellets. Or the melt blend may be extruded through a die designed to form the manufactured article comprising the polyolefin formulation.

Aspect 8. A method of making a crosslinked polyolefin product, the method comprising subjecting the polyolefin formulation of any one of aspects 1 to 6 to a curing condition in such a way so as to crosslink the (A) polyolefin polymer, thereby making the crosslinked polyolefin product. The curing condition may comprise exposing the formulation to ultraviolet light or heating the formulation with the (D) organic peroxide and, optionally, the (L) crosslinking coagent. Embodiments of the method may comprise heating an embodiment of the polyolefin formulation of any one of aspects 1 to 7 that comprises the (D) organic peroxide and, optionally, the (L) crosslinking coagent, in such a way so as to crosslink the (A) polyolefin polymer, thereby making a crosslinked polyolefin product. When the (L) crosslinking coagent is not used, the crosslinking comprises generating covalent carbon-carbon bonds between molecules of the (A) polyolefin polymer. When the (L) crosslinking coagent is included, the crosslinking comprises generating covalent carbon-carbon bonds between molecules of the (A) polyolefin polymer and generating covalent carbon-carbon bonds between molecules of the (L) crosslinking coagent and molecules of the (A) polyolefin polymer.

Aspect 9. A crosslinked polyolefin product made by the method of aspect 8. The crosslinked polyolefin product has increased electrical breakdown strength versus that of a crosslinked (A) polyolefin polymer that is free of one or both of the constituents (B) and (C). The crosslinked polyolefin product may comprise (A') a crosslinked (networked) polyethylene polymer made by crosslinking the (A) polyolefin polymer or a combination of the (A) polyolefin polymer and the (L) crosslinking coagent; and the constituents (B) and (C). The crosslinked polyolefin product may further comprise at least one additive selected from (F) an antioxidant; (G) a filler; (H) a flame retardant; (I) a hindered amine stabilizer; (J) a tree retardant; (K) a methyl radical scavenger; (M) a nucleating agent; and (N) a colorant (e.g., carbon black or titanium dioxide). The crosslinked polyolefin product has increased electrical breakdown strength versus that of a crosslinked (A) polyolefin polymer that is free of the constituents (B) and (C).

Aspect 10. An article comprising the polyolefin formulation of any one of aspects 1 to 6 or the crosslinked polyolefin product of aspect 9. The article has increased electrical breakdown strength versus that of an article containing the (A) polyolefin polymer that is free of one or both of the constituents (B) and (C). In some aspects the manufactured article is selected from: a coating, a film, a sheet, an extruded article (not pellets), and an injection molded article. E.g., coated conductors, insulation layers of wire and cables for transmitting electric power or telecommunications, agricultural film, automobile part, container, food packaging, garment bags, grocery bags, heavy-duty sacks, industrial sheeting, pallet and shrink wraps, bags, buckets, freezer containers, lids, toys. The manufactured article has increased electrical breakdown strength versus that of a crosslinked host polyolefin without the (B) alkoxyphenol compound and the (C) benzophenone compound.

Aspect 11. A coated conductor comprising a conductive core and an insulation layer at least partially covering the conductive core, wherein at least a portion of the insulation layer comprises the crosslinked polyolefin product of aspect 9. The coated conductor and its insulation layer have increased electrical breakdown strength versus that of a coated conductor or insulation layer containing the (A) polyolefin polymer that is free of one or both of the constituents (B) and (C). The conductive core may be a wire having proximal and distal ends, at least one end of which may be free of the insulation layer.

Aspect 12. A method of transmitting electricity, the method comprising applying a voltage across the conductive core of the coated conductor of aspect 10 so as to generate a flow of electricity through the conductive core. Also contemplated is a method of transmitting data using the inventive coated conductor that comprises the insulated electrical conductor.

Aspect 13. The invention of any one of aspects 1 to 12 wherein the polyolefin formulation has an improvement (increase) in electrical breakdown strength value eta, η, of at least +10.0percent (%) relative to that of a comparative formulation that is free of both the (B) alkoxyphenol compound and the (C) benzophenone compound; wherein the electrical breakdown strength values eta, η, are determined for a failure probability value of 63.2% using Weibull statistics according to the Electrical Breakdown Strength Test Method and Weibull Statistics Method described in the description. In some embodiments the inventive improvement (increase) in electrical breakdown strength value eta, η, (for a failure probability value of 63.2%) relative to that of the (A) polyolefin polymer that is free of a voltage stabilizer (e.g., relative to that of Comparative Example 0 (CE0) described later in the Examples) is at least +25%, alternatively at least +45%, alternatively at least +49%. In some embodiments the inventive improvement in electrical breakdown strength value eta, η, (for a failure probability value of 63.2%) relative to that of the (A) polyolefin polymer that is free of a voltage stabilizer (e.g., relative to that of CE0) is further characterized as being at most 75%, alternatively at most +65%, alternatively at most +59%, alternatively at most 55%. In some embodiments the inventive improvement in electrical breakdown strength value eta, η, (for a failure probability value of 63.2%) relative to that of the (A) polyolefin polymer that is free of a voltage stabilizer (e.g., relative to that of CE0) is from +45% to +54%. In some embodiments the inventive improvement in electrical breakdown strength value eta, η, (for a failure probability value of 63.2%) relative to that of the (A) polyolefin polymer that is free of a voltage stabilizer (e.g., relative to that of CE0) is +50%±5%. In some embodiments the crosslinked polyolefin product made from the polyolefin formulation has any one of the aforementioned inventive improvement in electrical breakdown strength value eta, η, (for a failure probability value of 63.2%). All of the foregoing electrical breakdown strength improvement percentage values eta, η, (for a failure probability value of 63.2%) are determined according to the Electrical Breakdown Strength Test Method described later. In some embodiments the values eta, η, (for a failure probability value of 63.2%) are further characterized by a 90% confidence level beta, β, determined according to the Electrical Breakdown Strength Test Method and Weibull Statistics Method described later.

Aspect 14. The invention of any one of aspects 1 to 13 wherein the polyolefin formulation has an improvement (increase) in electrical breakdown strength value eta, η, that is greater than the sum of eta of a first comparative formulation comprising (A) polyolefin polymer and benzophenone only plus eta of a second comparative formulation comprising (A) polyolefin polymer, 2-acetonaphthone, and 9-acetoanthracene, wherein the weight percent (wt %) of the benzophenone in the first comparative formulation is the same as the wt % of the (C) benzophenone compound in the polyolefin formulation; wherein the wt % of the 2-acetonaphthone in the second comparative formulation is the same as the wt % of the (B) alkoxyphenol compound in the polyolefin formulation; and wherein the wt % of the 9-acetoanthracene in the second comparative formulation is the same as the wt % of the (B) alkoxyphenol compound in the polyolefin formulation.

The coated conductor may be a power cable having proximal and distal ends, and the electricity may flow through the conductive core from the proximal end to the distal end, or vice versa. The conductive core may be a wire. The power cable may be a medium-voltage (MV), high-voltage (HV), or extra-high-voltage (EHV) power cable. The power cables are useful in electricity transmitting applications.

The (A) polyolefin polymer. Composed of polyethylene macromolecules that independently comprise at least 5, alternatively from 10 to 200,000 constituent units derived from polymerizing ethylene and zero, one or more other olefin-functional monomers. The (A) polyolefin polymer may have a density of from 0.870 to 0.975 gram per cubic centimeter ($g/cm^3$), alternatively from 0.890 to 0.930 $g/cm^3$ (e.g., LDPE or LLDPE), alternatively from 0.910 to 0.930 $g/cm^3$ (e.g., LDPE or LLDPE), alternatively from 0.931 to 0.945 $g/cm^3$ (e.g., MDPE), alternatively from 0.945 to 0.970 $g/cm^3$ (e.g., HDPE), all measured according to ASTM D792-13, Method B.

The polyethylene may be a homopolymer or a copolymer. The homopolymer is made by polymerizing only ethylene. The copolymer is made by polymerizing at least two different olefin monomers, one of which is ethylene. The copolymer may be a bipolymer made by polymerizing ethylene and one different olefin monomer, a terpolymer made by polymerizing ethylene and two different olefin monomers, or a tetrapolymer made by polymerizing ethylene and three different olefin monomers. The polyolefin that is a copolymer may be a block copolymer or a random copolymer.

Examples of the olefin-functional monomers used to make the (A) polyolefin polymer are ethylene, propene, ($C_4$-$C_{20}$) alpha-olefins, cyclic alkenes (e.g., norbornene), dienes (e.g., 1,3-butadiene), unsaturated carboxylic esters, and olefin-functional hydrolyzable silanes. Examples of the ($C_4$-$C_{20}$)alpha-olefin are a ($C_4$-$C_8$)alpha-olefin such as 1-butene, 1-hexene, or 1-octene; and a ($C_{10}$-$C_{20}$)alpha-olefin. Example of the diene is 1,3-butadiene. Examples of the unsaturated carboxylic esters are alkyl acrylates, alkyl methacrylates, and vinyl carboxylates (e.g., vinyl acetate). Examples of the olefin-functional hydrolyzable silanes are vinyltrialkoxysilanes, vinyltris(dialkylamino)silanes, and vinyl(trioximo)silanes.

In some embodiments the (A) polyolefin polymer is an ethylene-based polymer. An ethylene-based polymer comprises from 51 to 100 wt % of ethylenic units derived from polymerizing ethylene and from 49 to 0 wt % of comonomeric units derived from polymerizing one, alternatively two olefin-functional monomer (comonomer). The comonomer may be selected from propylene, a $(C_4-C_{20})$alpha-olefin, and 1,3-butadiene. The $(C_4-C_{20})$alpha-olefin may be a $(C_4-C_8)$alpha-olefin such as 1-butene, 1-hexene, or 1-octene.

Examples of suitable ethylene-based polymers are polyethylene homopolymers, ethylene/$(C_4-C_{20})$alpha-olefin copolymers, ethylene/propylene copolymers, ethylene/propylene/diene monomer (EPDM) copolymers such as an ethylene/propylene/1,3-butadiene terpolymer, and ethylene/1-butene/styrene copolymers. Examples of suitable ethylene/$(C_4-C_{20})$alpha-olefin copolymers are ethylene/1-butene copolymers, ethylene/1-hexene copolymers, and ethylene/1-octene copolymers. The ethylene-based polymers may be an ultra-low-density polyethylene (ULDPE), very low-density polyethylene (VLDPE), a linear low-density polyethylene (LLDPE), a low-density polyethylene (LDPE), a medium-density polyethylene (MDPE), a high-density polyethylene (HDPE), or an ultra-high-density polyethylene (UHDPE). Many of the ethylene-based polymers are sold by The Dow Chemical Company under trade names like AFFINITY, ATTANE, DOWLEX, ENGAGE, FLEXOMER, or INFUSE. Other ethylene-based polymers are sold by other suppliers under trade names like TAFMER, EXCEED, and EXACT. The LDPE and LLDPE are compositionally different by virtue of how they are made under different polymerization conditions: LDPE is made in a high pressure polymerization reactor in the presence of a free radical initiator (a peroxide or $O_2$) without an olefin polymerization catalyst, whereas LLDPE is made in a standard pressure polymerization reactor in the presence of an olefin polymerization catalyst and in the absence of a free radical initiator.

In some aspects the (A) polyolefin polymer is a polyethylene homopolymer, e.g., the low-density polyethylene (LDPE). All of the constituent units thereof are ethylenic repeat units. LDPE can be made by polymerizing ethylene in a high pressure reactor in the absence of a metal-based polymerization catalyst and in the presence of a small amount (e.g., 0.3 to 0.4 wt %) of a free radical initiator (e.g., a peroxide or mixture of peroxides or $O_2$) and 1 wt % of a chain transfer agent that is propylene.

In some embodiments the (A) polyolefin polymer consist of polymer of only one ethylene-based polymer (e.g., only LLDPE, or only LDPE, or only MDPE, or only HDPE). In some embodiments the (A) polyolefin polymer consists of an LDPE. When the (A) polyolefin polymer consists of an LDPE, in some such embodiments the polyolefin formulation may be free of any organic polymer other than the LDPE.

The (A) polyolefin polymer may be the ethylene/alpha-olefin copolymer. The ethylene/alpha-olefin copolymer may be an ethylene/1-butene copolymer, an ethylene/1-hexene copolymer, an ethylene/1-octene copolymer, or a combination of any two thereof. The constituent units of the ethylene/$(C_4-C_{20})$alpha-olefin copolymer consist of from 51 to 99.9 wt % ethylene-derived constituent units and from 49 to 0.1 wt % alpha-olefin-derived constituent units.

The (A) polyolefin polymer may be the ethylene/propylene copolymer. The constituent units of the ethylene/propylene copolymer consist of ethylenic monomeric units, propylenic comonomeric units, and, optionally, diene comonomeric units.

The (A) polyolefin polymer may be the ethylene/(unsaturated carboxylic ester) copolymer. The unsaturated carboxylic ester is vinyl acetate, an alkyl acrylate, or an alkyl methacrylate.

The (A) polyolefin polymer may be the ethylene/(monocyclic organosiloxane) copolymer. The monocyclic organosiloxane is of formula (III): $[R^1, R^2SiO_{2/2}]_n$ (III), wherein subscript n is an integer greater than or equal to 3; each $R^1$ is independently a $(C_2-C_4)$alkenyl or a $H_2C{=}C(R^{1a})—C({=}O)—O—(CH_2)_m—$ wherein $R^{1a}$ is H or methyl and subscript m is an integer from 1 to 4; and each $R^2$ is independently H, $(C_1-C_4)$ alkyl, phenyl, or $R^1$.

The (A) polyolefin polymer may comprise a blend two or more different ethylene-based polymers. In some embodiments the two or more different ethylene-based polymers of the blend includes a least one LDPE.

In some aspects the (A) polyolefin polymer consists of a low-density polyethylene (LDPE) polymer. The LDPE polymer is made by polymerizing ethylene in a high pressure reactor in the absence of a metal-based polymerization catalyst and in the presence of a small amount of a free radical initiator (e.g., a peroxide or $O_2$) and a chain transfer agent (CTA). The CTA may be propylene, which may be used at 1 wt % relative to the total weight of ethylene and propylene in the high pressure reactor. The LDPE polymer may have a density of from 0.910 to 0.930 g/$cm^3$ and a melt index ($I_2$) of from 1.0 to 5 g/10 min. The LDPE polymer may be LDPE-1 described in the Examples.

The polyolefin formulation may comprise from 60.0 to 99.9 wt % of the (A) polyolefin polymer; alternatively from 70.0 to 99.9 wt % of the (A) polyolefin polymer; alternatively from 85.0 to 99.9 wt % of the (A) polyolefin polymer; alternatively from 90.0 to 99.9 wt % of the (A) polyolefin polymer; all based on total weight of the polyolefin formulation.

The (B) an alkoxyphenol compound of formula (I):

(I)

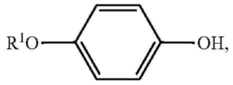

wherein $R^1$ is a $(C_1-C_{20})$alkyl. In some embodiments $R^1$ is a $(C_{11}-C_{20})$alkyl; alternatively a $(C_1-C_{10})$alkyl; alternatively a $(C_1-C_8)$alkyl; alternatively a $(C_1-C_3)$alkyl; alternatively a $(C_6-C_8)$alkyl; alternatively methyl; alternatively ethyl; alternatively propyl; alternatively butyl; alternatively 1-methylpropyl; alternatively pentyl; alternatively hexyl; alternatively heptyl; alternatively octyl; alternatively decyl. The $R^1$ may be methyl or heptyl and the (B) alkoxyphenol compound of formula (I) may be 4-methoxyphenol (CAS 150-76-5) or 4-heptyloxyphenol (CAS 13037-86-0). Alternatively, the $R^1$ may be decyl ($CH_3(CH_2)_9—$) and the (B) alkoxyphenol compound of formula (I) may be 4-decyloxyphenol.

The (C) benzophenone compound of formula (II):

(II)

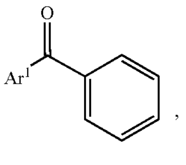

wherein $Ar^1$ is phenyl or an alkylphenyl.

The $Ar^1$ group in formula (II) may be the alkylphenyl. Alkylphenyl is a phenyl group independently substituted with from 1 to 5 ($C_1$-$C_{20}$)alkyl groups. Without being bound by theory it is believed that the alkyl substituent(s) on the phenyl aid in the solubility of the (C) benzophenone compound having same in the (A) polyolefin polymer.

The alkylphenyl may be a ($C_1$)alkylphenyl (i.e., a methylphenyl), a ($C_2$-$C_{20}$)alkylphenyl, or a combination thereof. Examples of ($C_1$)alkylphenyl (i.e., a methylphenyl) include 4-methylphenyl; 2,4-dimethyphenyl; 2,5-dimethylphenyl; 2,4,5-trimethylphenyl; and 2,3,4,t-tetramethylphenyl. Examples of ($C_2$-$C_{20}$)alkylphenyl include 4-ethylphenyl; 4-hexylphenyl; 4-decylphenyl; 4-nonadecylphenyl. Examples of the combination include 2-methyl-4-hexylphenyl.

In some embodiments $Ar^1$ is phenyl or a methyl-substituted phenyl; alternatively phenyl. The $Ar^1$ may be phenyl and the (C) benzophenone compound of formula (II) may be benzophenone per se (CAS 119-61-9). Alternatively, the $Ar^2$ may be 4-methylphenyl, 2,4-dimethylphenyl, 3,4-dimethylphenyl, or 4-(1,1-dimethylethyl)phenyl and the (C) benzophenone compound of formula (II) may be 4-methylbenzophenone (CAS 134-84-9), 2,4,-dimethylbenzophenone (CAS 1140-14-3), 3,4,-dimethylbenzophenone (CAS 2571-39-3), or 4-tert-butylbenzophenone (CAS 22679-54-5).

The polyolefin formulation and crosslinked polyolefin product made therefrom may be free of any voltage stabilizer compound except the (B) alkoxyphenol compound and the (C) benzophenone compound. Alternatively, the polyolefin formulation and crosslinked polyolefin product made therefrom may contain a third voltage stabilizer compound, which is different than the (B) alkoxyphenol compound and the (C) benzophenone compound.

The "proviso that x is less than 0.5y" means that the wt % loading, x, of the (B) alkoxyphenol compound in the formulation is less than one-half of the wt % loading, y, of the (C) benzophenone compound in the formulation. Surprisingly, if the wt % loading, x, of (B) alkoxyphenol compound in the formulation relative to the wt % loading, y, of the (C) benzophenone compound in the formulation is too high, the voltage stabilizing effect of the combination of (B) and (C) is decreased or even reversed, i.e., the relative effect becomes voltage destabilizing. As a function of the wt % loading, y, of the (C) benzophenone compound in the formulation, the wt % loading, x, of the (B) alkoxyphenol compound in the formulation may be from 0.03y to 0.30y, alternatively x may be from 0.05y to 0.24y.

Within the limitation of the "proviso that x is less than 0.5y", in some embodiments the amount of the (B) alkoxyphenol compound is from 0.15 to 0.94 wt %, alternatively from 0.20 to 0.44 wt %, alternatively from 0.35 to 0.44 wt %. In some embodiments the amount of the (C) benzophenone compound is from 1.0 to 7.4 wt %, alternatively from 1.5 to 7.5 wt %, alternatively from 1.5 to 2.9 wt %, alternatively from 1.8 to 2.4 wt %. All wt % are based on total weight of the polyolefin formulation or total weight of the crosslinked polyolefin product, respectively.

The constituent (D) organic peroxide: a molecule containing carbon atoms, hydrogen atoms, and two or more oxygen atoms, and having at least one —O—O— group, with the proviso that when there are more than one —O—O— group, each —O—O— group is bonded indirectly to another —O—O— group via one or more carbon atoms, or collection of such molecules. The (D) organic peroxide may be added to the polyolefin formulation for curing comprising heating the polyolefin formulation comprising constituents (A), (B), and (D) to a temperature at or above the (D) organic peroxide's decomposition temperature. The (D) organic peroxide may be a monoperoxide of formula $R^O$—O—O—$R^O$, wherein each $R^O$ independently is a ($C_1$-$C_{20}$)alkyl group or ($C_6$-$C_{20}$)aryl group. Each ($C_1$-$C_{20}$)alkyl group independently is unsubstituted or substituted with 1 or 2 ($C_6$-$C_{12}$) aryl groups. Each ($C_6$-$C_{20}$)aryl group is unsubstituted or substituted with 1 to 4 ($C_1$-$C_{10}$)alkyl groups. Alternatively, the (D) may be a diperoxide of formula $R^O$—O—O—R—O—O—$R^O$, wherein R is a divalent hydrocarbon group such as a ($C_2$-$C_{10}$)alkylene, ($C_3$-$C_{10}$)cycloalkylene, or phenylene, and each $R^O$ is as defined above. The (D) organic peroxide may be bis(1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis(1,1-dimethylethylperoxy) valeric acid; butyl ester; 1,1-bis(1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-t-butyl peroxide; 2,5-bis(t-butylperoxy)-2,5-dimethylhexane; 2,5-bis(t-butylperoxy)-2,5-dimethylhexyne-3,1,1-bis(t-butylperoxy)-3,3,5-trimethylcyclohexane; isopropylcumyl cumylperoxide; butyl 4,4-di(tert-butylperoxy) valerate; or di(isopropylcumyl) peroxide; or dicumyl peroxide. The (D) organic peroxide may be dicumyl peroxide. In some aspects only a blend of two or more (D) organic peroxides is used, e.g., a 20:80 (wt/wt) blend of t-butyl cumyl peroxide and bis(t-butyl peroxy isopropyl) benzene (e.g., LUPEROX D446B, which is commercially available from Arkema). In some aspects at least one, alternatively each (D) organic peroxide contains one —O—O— group. The (D) organic peroxide may be 0.29 to 0.44 wt %, alternatively 0.30 to 39 wt %, alternatively 0.30 to 0.37 wt % of the carrier mixture, alternatively of the polyolefin formulation.

The optional constituent (E) scorch retardant: a molecule that inhibits premature curing, or a collection of such molecules. Examples of a scorch retardant are hindered phenols; semi-hindered phenols; TEMPO; TEMPO derivatives; 1,1-diphenylethylene; 2,4-diphenyl-4-methyl-1-pentene (also known as alpha-methyl styrene dimer or AMSD); and allyl-containing compounds described in U.S. Pat. No. 6,277,925B1, column 2, line 62, to column 3, line 46. In some aspects the polyolefin formulation and crosslinked polyolefin product is free of (E). When present, the (E) scorch retardant may be from 0.01 to 1.5 wt %, alternatively 0.05 to 1.2 wt %, alternatively 0.1 to 1.0 wt % of the polyolefin formulation.

The optional constituent (F) antioxidant: an organic molecule that inhibits oxidation, or a collection of such molecules. The (F) antioxidant functions to provide antioxidizing properties to the polyolefin formulation and/or crosslinked polyolefin product. Examples of suitable (F) are bis(4-(1-methyl-1-phenylethyl)phenyl)amine (e.g., NAUGARD 445); 2,2'-methylene-bis(4-methyl-6-t-butylphenol) (e.g., VANOX MBPC); 2,2'-thiobis(2-t-butyl-5-methylphenol (CAS No. 90-66-4; 4,4'-thiobis(2-t-butyl-5-methylphenol) (also known as 4,4'-thiobis(6-tert-butyl-m-cresol), CAS No. 96-69-5, commercially LOWINOX TBM-6); 2,2'-thiobis(6-t-butyl-4-methylphenol (CAS No. 90-66-4, commercially LOWINOX TBP-6); tris[(4-tert-butyl-3-hydroxy-2,6-dimethylphenyl)methyl]-1,3,5-triazine-2,4,6-trione (e.g., CYANOX 1790); pentaerythritol tetrakis(3-(3,5-bis(1,1-dimethylethyl)-4-hydroxyphenyl) propionate (e.g., IRGANOX 1010, CAS Number 6683-19-8); 3,5-bis(1,1-dimethylethyl)-4-hydroxybenzenepropanoic acid 2,2'- thiodiethanediyl ester (e.g., IRGANOX 1035, CAS Number 41484-35-9); distearyl thiodipropionate ("DSTDP"); dilauryl thiodipropionate (e.g., IRGANOX PS 800); stearyl 3-(3,5-di-t-butyl-4-hydroxyphenyl)propionate (e.g., IRGANOX 1076); 2,4-bis(dodecylthiomethyl)-6-methylphenol (IRGANOX 1726); 4,6-bis(octylthiomethyl)-o-cresol (e.g. IRGANOX 1520); and 2',3-bis[[3-[3,5-di-tert-butyl-4-hydroxyphenyl]propionyl]]propionohydrazide (IRGANOX 1024). In some aspects (F) is 4,4'-thiobis(2-t-butyl-5-methylphenol) (also known as 4,4'-thiobis (6-tert-butyl-m-cresol); 2,2'-thiobis(6-t-butyl-4-methylphenol; tris[(4-tert-butyl-3-hydroxy-2,6-dimethylphenyl)methyl]-1,3,5-triazine-2,4,6-trione; distearyl thiodipropionate; or dilauryl thiodipropionate; or a combination of any two or more thereof. The combination may be tris[(4-tert-butyl-3-hydroxy-2,6-dimethylphenyl)methyl]-1,3,5-triazine-2,4,6-trione and distearyl thiodipropionate. In some aspects the polyolefin formulation and crosslinked polyolefin product is free of (F). When present, the (F) antioxidant may be from 0.01 to 1.5 wt %, alternatively 0.05 to 1.2 wt %, alternatively 0.1 to 1.0 wt % of the polyolefin formulation.

The optional constituent (G) filler: a finely-divided particulate solid or gel that occupies space in, and optionally affects function of, a host material. The (G) filler may be a calcined clay, an organoclays, or a hydrophobized fumed silica such as those commercially available under the CAB-O-SIL trade name from Cabot Corporation. The (G) filler may have flame retarding effects. In some aspects the polyolefin formulation and crosslinked polyolefin product is free of (G). When present, the (G) filler may be 1 to 40 wt %, alternatively 2 to 30 wt %, alternatively 5 to 20 wt % of the polyolefin formulation.

The optional constituent (H) flame retardant: a molecule or substance that inhibits combustion, or a collection of such molecules. The (H) may be a halogenated or halogen-free compound. Examples of (H) halogenated (H) flame retardants are organochlorides and organobromides, Examples of the organochlorides are chlorendic acid derivatives and chlorinated paraffins. Examples of the organobromides are decabromodiphenyl ether, decabromodiphenyl ethane, polymeric brominated compounds such as brominated polystyrenes, brominated carbonate oligomers, brominated epoxy oligomers, tetrabromophthalic anhydride, tetrabromobisphenol A and hexabromocyclododecane. Typically, the halogenated (H) flame retardants are used in conjunction with a synergist to enhance their efficiency. The synergist may be antimony trioxide. Examples of the halogen-free (H) flame retardant are inorganic minerals, organic nitrogen intumescent compounds, and phosphorus based intumescent compounds. Examples of the inorganic minerals are aluminum hydroxide and magnesium hydroxide. Examples of the phosphorous-based intumescent compounds are organic phosphonic acids, phosphonates, phosphinates, phosphonites, phosphinites, phosphine oxides, phosphines, phosphites, phosphates, phosphonitrilic chloride, phosphorus ester amides, phosphoric acid amides, phosphonic acid amides, phosphinic acid amides, melamine and melamine derivatives thereof, including melamine polyphosphate, melamine pyrophosphate and melamine cyanurate, and mixtures of two or more of these materials. Examples include phenylbisdodecyl phosphate, phenylbisneopentyl phosphate, phenyl ethylene hydrogen phosphate, phenyl-bis-3,5,5' trimethylhexyl phosphate), ethyldiphenyl phosphate, 2 ethylhexyl di(p-tolyl) phosphate, diphenyl hydrogen phosphate, bis(2-ethyl-hexyl) para-tolylphosphate, tritolyl phosphate, bis(2-ethylhexyl)-phenyl phosphate, tri(nonylphenyl) phosphate, phenylmethyl hydrogen phosphate, di(dodecyl) p-tolyl phosphate, tricresyl phosphate, triphenyl phosphate, triphenyl phosphate, dibutylphenyl phosphate, 2-chloroethyldiphenyl phosphate, p-tolyl bis(2,5,5'-trimethylhexyl) phosphate, 2-ethylhexyldiphenyl phosphate, and diphenyl hydrogen phosphate. Phosphoric acid esters of the type described in U.S. Pat. No. 6,404,971 are examples of phosphorus-based flame retardants. Additional examples include liquid phosphates such as bisphenol A diphosphate (BAPP) (Adeka Palmarole) and/or resorcinol bis(diphenyl phosphate) (Fyroflex RDP) (Supresta, ICI), solid phosphorus such as ammonium polyphosphate (APP), piperazine pyrophosphate and piperazine polyphosphate. Ammonium polyphosphate is often used with flame retardant co-additives, such as melamine derivatives. Also useful is Melafine (DSM) (2,4,6-triamino-1,3,5-triazine; fine grind melamine). In some aspects the polyolefin formulation and crosslinked polyolefin product is free of (H). When present, the (H) may be in a concentration of from 0.01 to 70 wt %, alternatively 0.05 to 40 wt %, alternatively 1 to 20 wt % of the polyolefin formulation.

The optional constituent (I) hindered amine stabilizer: a molecule that contains a basic nitrogen atom that is bonded to at least one sterically bulky organo group and functions as an inhibitor of degradation or decomposition, or a collection of such molecules. The (I) is a compound that has a sterically hindered amino functional group and inhibits oxidative degradation and can also increase the shelf lives of embodiments of the polyolefin formulation that contain (D) organic peroxide. Examples of suitable (I) are butanedioic acid dimethyl ester, polymer with 4-hydroxy-2,2,6,6-tetramethyl-1-piperidine-ethanol (CAS No. 65447-77-0, commercially LOWILITE 62); and N,N'-bisformyl-N, N'-bis(2,2,6,6-tetramethyl-4-piperidinyl)-hexamethylenediamine (CAS No. 124172-53-8, commercially Uvinul 4050 H). In some aspects the polyolefin formulation and crosslinked polyolefin product is free of (I). When present, the (I) hindered amine stabilizer may be from 0.001 to 1.5 wt %, alternatively 0.002 to 1.2 wt %, alternatively 0.002 to 1.0 wt %, alternatively 0.005 to 0.5 wt %, alternatively 0.01 to 0.2 wt %, alternatively 0.05 to 0.1 wt % of the polyolefin formulation.

The optional constituent (J) tree retardant: a molecule that inhibits water and/or electrical treeing, or a collection of such molecules. The tree retardant may be a water tree retardant or electrical tree retardant. The water tree retardant is a compound that inhibits water treeing, which is a process by which polyolefins degrade when exposed to the combined effects of an electric field and humidity or moisture. The electrical tree retardant, also called a voltage stabilizer, is a compound that inhibits electrical treeing, which is an electrical pre-breakdown process in solid electrical insulation due to partial electrical discharges. Electrical treeing can occur in the absence of water. Water treeing and electrical treeing are problems for electrical cables that contain a coated conductor wherein the coating contains a polyolefin. The (J) may be a poly(ethylene glycol) (PEG). In some aspects the polyolefin formulation and crosslinked polyolefin product is free of (J). When present, the (J) tree retardant may be from 0.01 to 1.5 wt %, alternatively 0.05 to 1.2 wt %, alternatively 0.1 to 1.0 wt % of the polyolefin formulation.

The optional constituent (K) methyl radical scavenger: a molecule that is reactive with methyl radicals, or a collection of such molecules. The (K) react with methyl radicals in the polyolefin formulation or crosslinked polyolefin product. The (K) may be a "TEMPO" derivative of 2,2,6,6-tetramethyl-1-piperidinyl-N-oxyl or a 1,1-diarylethylene.

Examples of TEMPO derivatives are 4-acryloxy-2,2,6,6-tetramethyl-1-piperidinyl-N-oxyl (CAS No. 21270-85-9, "acrylate TEMPO"), 4-allyloxy-2,2,6,6-tetramethyl-1-piperidinyl-N-oxyl (CAS No. 217496-13-4, "allyl TEMPO"); bis(2,2,6,6-tetramethyl-1-piperidinyl-N-oxyl) sebacate (CAS No. 2516-92-9, "bis TEMPO")); N,N-bis(acryloyl-4-amino)-2,2,6,6-tetramethyl-1-piperidinyl-N-oxyl (CAS No. 1692896-32-4, "diacrylamide TEMPO"); and N-acryloyl-4-amino-2,2,6,6-tetramethyl-1-piperidinyl-N-oxyl (CAS No. 21270-88-2, "monoacrylamide TEMPO"). Examples of 1,1-diarylethylenes are 1,1-diphenylethylene and alpha-methylstyrene. In some aspects the polyolefin formulation and crosslinked polyolefin product is free of (K). When present, the (K) methyl radical scavenger may be from 0.01 to 1.5 wt %, alternatively 0.05 to 1.2 wt %, alternatively 0.1 to 1.0 wt % of the polyolefin formulation.

The optional constituent (L) crosslinking coagent: a molecule that contains a backbone or ring substructure and one, alternatively two or more propenyl, acrylate, and/or vinyl groups bonded thereto, wherein the substructure is composed of carbon atoms and optionally nitrogen atoms, or a collection of such molecules. The (L) crosslinking coagent is free of silicon atoms. The (L) crosslinking coagent may be a propenyl-functional crosslinking coagent as described by any one of limitations (i) to (v): (i) (L) is 2-allylphenyl allyl ether; 4-isopropenyl-2,6-dimethylphenyl allyl ether; 2,6-dimethyl-4-allylphenyl allyl ether; 2-methoxy-4-allylphenyl allyl ether; 2,2'-diallyl bisphenol A; O,O'-diallyl bisphenol A; or tetramethyl diallylbisphenol A; (ii) (L) is 2,4-diphenyl-4-methyl-1-pentene or 1,3-diisopropenylbenzene; (iii) (L) is triallyl isocyanurate ("TAIC"); triallyl cyanurate ("TAC"); triallyl trimellitate ("TATM"); N,N,N',N',N",N"-hexaallyl-1,3,5-triazine-2,4,6-triamine ("HATATA"; also known as $N^2,N^2,N^4,N^4,N^6,N^6$-hexaallyl-1,3,5-triazine-2,4,6-triamine); triallyl orthoformate; pentaerythritol triallyl ether; triallyl citrate; or triallyl aconitate; (iv) (L) is a mixture of any two of the propenyl-functional coagents in (i). Alternatively, the (L) may be an acrylate-functional crosslinking coagent selected from trimethylolpropane triacrylate ("TMPTA"), trimethylolpropane trimethylacrylate ("TMPTMA"), ethoxylated bisphenol A dimethacrylate, 1,6-hexanediol diacrylate, pentaerythritol tetraacrylate, dipentaerythritol pentaacrylate, tris(2-hydroxyethyl) isocyanurate triacrylate, and propoxylated glyceryl triacrylate. Alternatively, the (L) may be a vinyl-functional crosslinking coagent selected from polybutadiene having at least 50 wt % 1,2-vinyl content and trivinyl cyclohexane ("TVCH"). Alternatively, the (L) may be a crosslinking coagent described in U.S. Pat. No. 5,346,961 or U.S. Pat. No. 4,018,852. Alternatively, the (L) may be a combination or any two or more of the foregoing crosslinking coagents. In some aspects the polyolefin formulation and crosslinked polyolefin product is free of (L). When present, the (L) crosslinking coagent may be 0.01 to 4.5 wt %, alternatively 0.05 to 2 wt %, alternatively 0.1 to 1 wt %, alternatively 0.2 to 0.5 wt % of the polyolefin formulation.

The optional constituent (M) processing aid: an organic or organosiloxane additive that enhances flowability of a melt of the (A) polyolefin polymer during extrusion thereof. Examples of (M) are poly(fluoroethylene) polymers and polydimethylsiloxanes. In some aspects the polyolefin formulation and crosslinked polyolefin product is free of (M). When present, the (M) may be in a concentration of from 0.01 to 1.5 wt %, alternatively 0.05 to 1.2 wt %, alternatively 0.1 to 1.0 wt % of the polyolefin formulation.

The optional constituent (N) colorant (e.g., carbon black or $TiO_2$). Carbon black: a finely-divided form of paracrystalline carbon having a high surface area-to-volume ratio, but lower than that of activated carbon. Examples of carbon black are furnace carbon black, acetylene carbon black, conductive carbons (e.g., carbon fibers, carbon nanotubes, graphene, graphite, and expanded graphite platelets). In some aspects the polyolefin formulation and crosslinked polyolefin product is free of (N). When present, the (N) may be in a concentration of from 0.01 to 40 wt %, alternatively 0.05 to 35 wt %, alternatively 0.1 to 20 wt %, alternatively 0.5 to 10 wt %, alternatively 1 to 5 wt %, of the polyolefin formulation.

For avoidance of doubt, the (G) filler and (N) colorant are different.

In addition the polyolefin formulation may independently further comprise one or more other optional additives selected from a carrier resin, lubricant, slip agent, plasticizer, surfactant, extender oil, acid scavenger, and metal deactivator.

The crosslinked polyolefin product may also contain by-products of curing such as alcohol and ketone by-products of the reaction of the (D) organic peroxide. When the polyolefin formulation further contains one or more of any optional additives or constituents such as (F) antioxidant, the crosslinked polyolefin product may also contain the any one or more of the optional additives or constituents such as (F), or one or more reaction products formed therefrom during the curing of the polyolefin formulation.

The crosslinked polyolefin product may be in a divided solid form or in continuous form. The divided solid form may comprise granules, pellets, powder, or a combination of any two or more thereof. The continuous form may be an article of manufacture such as molded part (e.g., injection molded part) or an extruded part (e.g., a coated conductor or a cable).

The coated conductor. The coated conductor may be an insulated electrical conductor. The insulated electrical conductor may be a coated metal wire or an electrical cable, including a power cable for use in low voltage ("LV", >0 to <5 kilovolts (kV)), medium voltage ("MV", 5 to <69 kV), high voltage ("HV", 69 to 230 kV) or extra-high voltage ("EHV", >230 kV) data transmitting and electricity-transmitting/distributing applications. A "wire" means a single strand or filament of conductive material, e.g., conductive metal such as copper or aluminum. A "cable" and "power cable" are synonymous and mean an insulated electrical conductor comprising at least one wire disposed within a covering that may be referred to as a sheath, jacket (protective outer jacket), or coating. The insulated electrical conductor may be designed and constructed for use in medium, high, or extra-high voltage applications. Examples of suitable cable designs are shown in U.S. Pat. Nos. 5,246,783; 6,496,629; and 6,714,707.

The insulated electrical conductor may contain a conductor/transmitter core and an outer single layer covering or an outer multilayer covering disposed therearound so as to protect and insulate the conductor/transmitter core from external environments. The conductor/transmitter core may be composed of one or more metal wires. When the conductor/transmitter core contains two or more metal wires, the metal wires may be sub-divided into discrete wire bundles. Each wire in the conductor/transmitter core, whether bundled or not, may be individually coated with an insulation layer and/or the discrete bundles may be coated with an insulation layer. The single layer covering or multilayer covering (e.g., a single layer or multilayer coating or sheath) primarily functions to protect or insulate the conductor/transmitter core from external environments such as sunlight, water, heat, oxygen, other conductive materials (e.g., to prevent short-circuiting), and/or other corrosive materials (e.g., chemical fumes).

The single layer or multilayer covering from one insulated electrical conductor to the next may be configured differently depending upon their respective intended uses. For example, viewed in cross-section, the multilayer covering of the insulated electrical conductor may be configured sequentially from its innermost layer to its outermost layer with the following components: an inner semiconducting layer, a crosslinked polyolefin insulation layer comprising the crosslinked polyolefin product (inventive crosslinked product), an outer semiconducting layer, a metal shield, and a protective sheath. The layers and sheath are circumferentially and coaxially (longitudinally) continuous. The metal shield (ground) is coaxially continuous, and circumferentially either continuous (a layer) or discontinuous (tape or wire). Depending on the intended application the multilayer covering for the insulated optical fiber may omit the semiconducting layers and/or the metal shield. The outer semiconducting layer, when present, may be composed of a peroxide-crosslinked semiconducting product that is either bonded or strippable from the crosslinked polyolefin layer.

In some aspects is a method of making the coated conductor, the method comprising extruding a coating comprising a layer of the polyolefin formulation onto a conductor/transmitter core to give a coated core, and passing coated core through a continuous vulcanization (CV) apparatus configured with suitable CV conditions for curing the polyolefin formulation to give the coated conductor. CV conditions include temperature, atmosphere (e.g., nitrogen gas), and line speed or passage time period through the CV apparatus. Suitable CV conditions may give a coated conductor exiting the CV apparatus, wherein the coated conductor contains a crosslinked polyolefin layer formed by curing the layer of the crosslinked polyolefin layer.

Electrical breakdown strength (dielectric strength): the maximum electric field (voltage applied divided by electrode separation distance) that an electrically insulative material can withstand without experiencing an electrical breakdown event, i.e., without becoming electrically conductive. Expressed in volts using a standard electrode separation distance.

Any compound, composition, formulation, material, mixture, or reaction product herein may be free of any one of the chemical elements selected from the group consisting of: H, Li, Be, B, C, N, O, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, Hf, Ta, W, Re, Os, Ir, Pt, Au, Hg, Tl, Pb, Bi, lanthanoids, and actinoids; with the proviso that chemical elements that are inherently required by the compound, composition, formulation, material, mixture, or reaction product (e.g., C and H required by a polyethylene, or C, H, and O required by an alcohol) are not omitted.

Alternatively precedes a distinct embodiment. ANSI is the American National Standards Institute organization headquartered in Washington, D.C., USA. ASME is the American Society of Mechanical Engineers, headquartered in New York City, New York, USA. ASTM is the standards organization, ASTM International, West Conshohocken, Pennsylvania, USA. Any comparative example is used for illustration purposes only and shall not be prior art. Free of or lacks means a complete absence of; alternatively not detectable. IEC is International Electrotechnical Commission, 3 rue de Varemb, Case postale 131, CH-1211, Geneva 20, Switzerland, http://www.iec.ch. IUPAC is International Union of Pure and Applied Chemistry (IUPAC Secretariat, Research Triangle Park, North Carolina, USA). Periodic Table of the Elements is the IUPAC version of May 1, 2018. May confers a permitted choice, not an imperative. Operative means functionally capable or effective. Optional(ly) means is absent (or excluded), alternatively is present (or included). Properties may be measured using standard test methods and conditions. Ranges include endpoints, subranges, and whole and/or fractional values subsumed therein, except a range of integers does not include fractional values. Room temperature: 23°±1° C.

Unless stated otherwise, definitions of terms used herein are taken from the IUPAC Compendium of Chemical Technology ("Gold Book") version 2.3.3 dated Feb. 24, 2014.

In some embodiments any one of the terms "comprising" or "comprises" may be replaced by the phrase "consisting essentially of" or "consists essentially of". The phrases "consisting essentially of" and "consists essentially of" are partially-closed ended and mean that the polyolefin formulation and the crosslinked polyolefin product made therefrom are free of the excluded materials. For example, the excluded materials may comprise any voltage stabilizer that is not the one and only compound (B) alkoxyphenol compound and the (C) benzophenone compound. Use of the term "comprises" or "comprising" in referring to a material or feature that follows does not negative the partially closed ended nature of the "consisting essentially of" or "consists essentially of", but merely allows any additional material or feature that is not explicitly excluded by the "consisting essentially of" or "consists essentially of. In some embodiments any one of the terms "comprising" or "comprises" may be replaced by the phrase "consisting of" or "consists of". The phrases "consisting of" and "consists of" are closed-ended and exclude any element or feature that is not explicitly listed thereafter.

For brevity, only certain ranges are explicitly disclosed herein. However, ranges from any lower limit may be combined with any upper limit to recite a range not explicitly recited. Also, ranges from any lower limit may be combined with any other lower limit to recite a range not explicitly recited; and in the same way, ranges from any upper limit may be combined with any other upper limit to recite a range not explicitly recited.

Density Test Method: measured according to ASTM D792-13, *Standard Test Methods for Density and Specific Gravity (Relative Density) of Plastics by Displacement,* Method B (for testing solid plastics in liquids other than water, e.g., in liquid 2-propanol). Report results in units of grams per cubic centimeter (g/$cm^3$).

Melt index ($I_2$) is measured according to ASTM D1238-04 (190° C., 2.16 kg), *Standard Test Method for Melt Flow Rates of Thermoplastics by Extrusion Platometer,* using conditions of 190° C./2.16 kilograms (kg), formerly known as "Condition E" and also known as $I_2$. Report results in units of grams eluted per 10 minutes (g/10 min.) or the equivalent in decigrams per 1.0 minute (dg/1 min.). 10.0 dg=1.00 g.

The inventive embodiments may be tested according to the following Electrical Breakdown Strength Test Method. The description of the method is separated for clarity into sections 1 to 3. Section 1 deals with the materials used to prepare a test assembly. Section 2deals with the procedure for preparing a test plaque representing an insulation layer and preparing the test assembly. The test assembly comprises a sandwich of the test plaque representing an insulation layer and two conductor disks, wherein the test plaque (insulation layer) is disposed between the conductor disks. Section 3 deals with a procedure for applying an increasing test voltage to the test assembly, and detecting an electrical breakdown event in the insulation layer.

Section 1: Electrical Breakdown Strength Test Method (materials): conductors are a plurality of 40 millimeter (mm) diameter aluminum disks and a plurality of 29 mm diameter aluminum disks; wherein each disk 75 microns thick. Sandwich test insulation layer between the conductors so that the total thickness of the sandwich is 350 to 500 microns. After breakdown, remove Al disks and measure thickness of the insulation layer at the location of breakdown.

Section 2: Electrical Breakdown Strength Test Method (procedure for assembling electrodes and test plaques into test assemblies). Prepare samples of test insulation layers in a two-step thermal molding process: step 1: Weigh polymer pellets. Place the weighed pellets in a compression mold (8-inch by 8-inch square compression molding frame, of from about 150 to about 900 microns thickness). Pre-warm the polymer pellets under about 7 pounds per square inch (psi) to 140° C. for 3 minutes. Under the same temperature, switch to high pressure of about 382 psi, and hold for 3 minutes. Under the same pressure, cool down the resulting polymer plaque to room temperature within about 15 minutes. Step 2: Cut a plurality of conductive aluminum (Al) disks of 29 mm and 40 mm diameter out from aluminum sheets of 75 microns thick. Place the conductive Al disks on top and bottom of the plaque (prepared in step 1), with the 29 mm diameter disks on one side and 40-mm diameter disks on the opposite side. The two conductive Al disks are opposing each other and positioned approximately concentric with each other. Position 3-by-3 array of 9 such conductive Al disk pairs, spaced apart on each side of the 8 inch×8 inch polymer plaque. Thermally compress the resulting assembly in the same compression mold and under the same protocol as in step 1. Then place the assembly between two brass electrodes to give the test assembly. Each test assembly has nine pairs of upper and lower brass electrodes, nine pairs of upper and lower conductive Al disks, and a single plaque sandwiched between the nine pairs of upper and lower conductive Al disks.

A portion 1 of the test assembly is shown in FIG. 1. Each test assembly has nine portions 1. Portion 1 of the test assembly includes one of the nine pairs of upper and lower brass electrodes 11 and 15, respectively; one of the nine pairs of upper and lower conductive Al disks 21 and 25, respectively; and a portion of the single plaque 30 (FIG. 1). Each pair of brass electrodes 11 and 15 is in electrical communication with a device (not shown) configured for supplying electrical current, detecting electrical breakdown, and measuring voltage thereat. Such devices are well known, e.g., see ASTM D149-20, *Standard Test Method for Dielectric Breakdown Voltage and Dielectric Strength of Solid Electrical Insulating Materials at Commercial Power Frequencies;* and IEC 243-1, *Methods of Test for Electrical Strength of Solid Insulating Materials Part* 1: *Tests at Power Frequencies.* Brass electrodes 11 and 15 are used to apply the electrical current to its pair of conductive Al disks 21 and 25 respectively. Upper conductive Al disk 21 independently has lower surface 22 and upper surface 23 and its disk thickness is the distance therebetween (i.e., distance from 22 to 23). Lower conductive Al disk 25 independently has lower surface 27 and upper surface 26 and its disk thickness is the distance therebetween (i.e., distance from 26 to 27). Different portions of plaque 30 are sandwiched between spaced-apart and different pairs of conductive Al disks 21 and 25, respectively. The thickness of the plaque 30 between the conductive Al disks 21 and 25 is the distance between the lower surface 22 of upper conductive Al disk 21 and the upper surface 26 of lower conductive Al disk 25. Each portion of plaque 30 independently has upper surface 31. The thickness T of the portion of plaque 30 used in the determination of the electrical breakdown strength in Section 3 below is the distance between the upper surface 26 of lower conductive Al disk 25 and the upper surface 31 of plaque 30. This thickness T is indicated by the "} T" in FIG. 1 and is measured at location of a channel created by the electrical breakdown event referenced in Section 3.

Section 3: Electrical Breakdown Strength Test Method: procedure for applying an alternating electrical current (AC) with increasing test voltage to the test assembly and detecting an electrical breakdown event. Submerge the assembly prepared above in insulation oil and contact same at top and bottom by brass electrodes. Apply voltage. Gradually increase the voltage at a rate of 500 V/S (volts per second, 50 Hz) until a breakdown event takes place, resulting in a channel being created that penetrates through the polymer. A breakdown event is detected as a sudden increase in electrical current. The applied kilovoltage (V) at which this jump in electrical current event occurs is recorded. Such a breakdown event results from a channel being created by the applied voltage in the insulation layer. Thickness of the insulation layer at the location of the channel is measured and used as the insulation thickness in the following calculation of actual breakdown strength ($E_{act}$)=V/T wherein V is breakdown voltage in kilovolts (kV) and T is the insulation thickness in millimeters (mm) measured at the channel and $E_{act}$ is actual breakdown strength in kilovolts per millimeter (kV/mm). For reporting purposes in the tables that follow the actual breakdown strength $E_{act}$ is normalized to 1.016 millimeter (mm, equal to 40 mils) thickness and reported as normalized breakdown strength E in kV/mm. The normalized breakdown strength E is calculated according to Equation 1 (Eq. 1): $E=(V/T)*(T/T_0)^(½)$ (Eq. 1), wherein ^(½) indicates square root, V is the applied kilovoltage at breakdown event, each T is the measured thickness of the insulation layer (plaque, at the location of breakdown), and $T_0$ is thickness of 1.016 mm (equivalent to 40 mils) such that $T/T_0$ normalizes the breakdown strength value to 1.016 mm thickness. Record the voltage at which electrical breakdown event occurs. Evaluate efficacy of voltage stabilizer by comparing breakdown field strength of the same polymer with and without additive.

In the inventive electrical breakdown strength test method, the voltage at which the electrical breakdown event occurs will vary depending upon thickness of the insulation layer. Analyze the normalized breakdown strength E, having the unit of kV/mm, with well-known two-parameter Weibull statistics according to the Weibull Statistics Method described below.

Weibull Statistics Method. The electrical breakdown strength values for eta, η, and beta, β, are determined for a test sample set of size N by a two-parameter Weibull Statistics Method according to Equation 2 (Eq. 2):

$$F(E) = 1 - e^{-\left(\frac{E}{\eta}\right)^{\beta}}. \qquad \text{Eq. 2}$$

E is the normalized field strength in kV/mm as determined as described above. F(E) is the cumulative fraction of samples of the sample set that failed at normalized field strength E. To obtain a proper curve fitting, determine F(E) of a set of samples N by calculating the median ranks of each sample of the set according to steps (1) and (2): (1) rank normalized electric field strength, E, at failure in ascending order from 1 to N (for a sample set of size N); (2) using Bernard approximation, determine the median rank (MR) of each sample, i, according to Equation 3: MR=F(E)=(i−0.3)/(N+0.4) (Eq. 3) wherein i ranges from 1 to N (e.g., if N=9, a first sample is i=1, a second sample is i=2, et seq.). In a graph, plot values for cumulative fraction F(E) on a scale from 1 to 99 on the y-axis versus values for normalized field strength E on a scale from 5 to 100 kV/mm (or whatever range is convenient for the values E being plotted) on the x-axis. Knowing cumulative fraction F(E) and E of a set of samples N, perform a curve fitting based on Equation Eq. 2 to obtain the eta, η, and beta, β, values. Eta, η, is equivalent to the field strength whereat 63.2% of the samples have failed. Beta, β, is related to the range of normalized field strength E within which the all (100%) of samples N failed. All other things being equal, the higher the β value, the narrower the range of filed strength within which the test samples N fail. For example, first beta, β, will be higher for a first sample set (N=9) if all samples of the first sample set fail within a range of E 16 kV/mm to E 29 kV/mm (13 kV/mm spread between lowest E 16 kV/mm and highest E 29 kV/mm) than second beta, β, of a second sample set (N=9) wherein all samples of the second sample set fail within a range of E 16 kV/mm to E 30 kV/mm (14 kV/mm spread between lowest E 16 kV/mm and highest E 30 kV/mm).

The electrical breakdown strength value used to determine improvement or diminishment relative to a baseline value for CE0 is the value eta, η, that is a predicted for a failure probability value of 63.2% and is determined from the normalized field strength E values using the Weibull statistics described above. Also reported is the 90% confidence levels (upper and lower) beta, β, value, b, obtained using the Weibull statistics described above. All other things being equal, the higher the β value, the narrower the range of filed strength within which the test samples N fail, and therefore the narrower is the range of E at the 90% confidence level.

All other things being equal, including thickness of the insulation layer, the higher the voltage at which the electrical breakdown strength occurs, the greater the electrical breakdown strength of the insulation material. Determine the percent increase (improvement) or percent decrease (degradation) in voltage of the test plaque (N=8 or 9) at which the electrical breakdown event occurs relative to the voltage of the 17 control plaques (N=153 or 155) at which its electrical breakdown event occurs. The greater the percentage increase, the greater the improvement in electrical breakdown strength. The greater the percentage decrease, the greater the degradation of electrical breakdown strength.

EXAMPLES

Polyethylene polymer (A)-1: a low-density polyethylene (LDPE-1). LDPE-1 has a density 0.920 g/$cm^3$ and a melt index of 2.0 g/10 min. Available from The Dow Chemical Company as DFDK-7423NT.

Inventive alkoxyphenol compound (B)-1:4-methoxyphenol, which is a compound of formula (I) wherein $R^1$ is methyl.

Inventive alkoxyphenol compound (B)-2: 4-heptyloxyphenol, which is a compound of formula (I) wherein $R^1$ is heptyl.

Inventive benzophenone compound (C)-1: benzophenone, which is a compound of formula (II) wherein $Ar^1$ is phenyl.

Use to evaluate test compounds, including the (B) alkoxyphenol compound by itself (comparative), the (C) benzophenone compound by itself (comparative), and blends thereof (inventive), for effects on electrical breakdown strength of polyolefin formulations. Tested embodiments of the inventive polyolefin formulations comprise a test compound that is the (B) alkoxyphenol compound, a test compound that is the (C) benzophenone compound of formula (II), and the polyethylene polymer (A)-1. A first comparative polyolefin formulation comprises a test compound that is the (B) alkoxyphenol compound and the polyethylene polymer (A)-1 but not containing the (C) benzophenone compound of formula (II). A second comparative polyolefin formulation comprises a test compound that is the (C) benzophenone compound of formula (II) and the polyethylene polymer (A)-1 but not containing the (B) alkoxyphenol compound. A third comparative formulation comprises the polyethylene polymer (A)-1 but not containing compounds (B) or (C). Prepare the formulations for testing by melt-compounding a known quantity of test compound into the polyethylene polymer (A)-1 such that the concentration of the test compound in the test formulation is from 0.1 to 10.0 wt %, based on total weight of the formulation. Concentrations of 0.5 wt % and 1.0 wt % of test compound are convenient amounts to use for testing purposes, but higher concentrations may be used if desired. Separately fabricate the formulations into test plaques according to the procedure described earlier for the Electrical Breakdown Strength Test Method and determine the voltage at which an electrical breakdown event occurs. Report results as eta value for a failure probability value of 63.2% as determined according to Weibull statistics described above.

Comparative Example 0 (CE0). Prepare a single batch of a stabilizer-free comparative formulation consisting of 100.00 wt % of polyethylene polymer (A)-1. The batch of stabilizer-free comparative formulation is free of a voltage stabilizer or any additive. In separate experiments, melt compound different samples of the stabilizer-free comparative formulation into 17 test plaques. Measure electrical breakdown strength of each test plaque using a 3-by-3 array of nine electrode pairs to obtain 153 actual electrical breakdown strength values. Normalize the electrical breakdown strength values to a plaque thickness of 40 mm according to Eq. 1 described earlier. Normalized electrical breakdown strength value for CE0 is eta, η, value (for a failure probability value of 63.2%) of 18.49 kV/mm with a 90% confidence level, beta, of 18.18 to 18.81 kV/mm (lower limit to higher limit). Compare all comparative and inventive eta, η, values for percent improvement for a failure probability value of 63.2% against the 18.5 kV/mm as the baseline (unimproved or undiminished) normalized electrical breakdown strength value for a failure probability value of 63.2%.

The procedure used to run the experiments of the comparative examples and inventive examples described below comprises the following steps: (1) a Brabender mixer is turned on an allowed to heat up while the bowl is empty until the temperature recorded is about 140° C. (2) The Brabender bowl is charged with about 260 grams of (A) polyethylene polymer resin and allowed to mix until it is melted at 40 rpms for up to 10 minutes. (3) The mixing speed (rpm) is reduced, the rotation of the twin screws is reversed allowing for some sample is taken out for further testing. (4) Additional amount of (A) polyethylene polymer and compounds (B) and (C) are added such that the bowl capacity is refilled to 260 g at target additive loading and the rpms raised back to 40 rpm. (5) The resulting sample is allowed to mix for up to 5 minutes. (6) The mixing speed (rpm) is reduced, the rotation of the twin screws is reversed allowing for some sample is taken out for further testing. (7) Steps 4-6 are repeated to create a series of additive concentrations in the polyethylene up to 2 wt %/. Typically compounding is carried out at 0.5 wt %, 1 wt% and 2 wt %. (8) Mixing speed (rpm) is reduced, the rotation of the twin screws is reversed allowing for some sample is taken out for further testing. (9) Step 9 is the end of the experiment. (10) Samples are pressed into think plaques approximately 15 mils thick. (11) Aluminum discs are embedded into the sample at top and bottom and taken for electrical testing (see measurement section below for schematic of that process). Note on blend mixture additive preparation: Blend mixture is prepared by adding equal weight proportions of the two additives onto the weighing bowl and then mixing with a spatula.

Comparative Examples 1 to 6 (CE1 to CE6): In separate runs melt compound polyethylene polymer (A)-1 with either (CE1) a first known amount of (B)-1, 4-methoxyphenol; (CE2) a second known amount of (B)-1; (CE3) a known amount of (B)-2, 4-heptyloxyphenol; (CE4) a first known amount of (C)-1 benzophenone; (CE5) a second known amount of (C)-1 benzophenone; or (CE6) a third known amount of (C)-1 benzophenone, all as shown in Table 1 below to give comparative polyolefin formulations CE1 to CE6, respectively. Test the formulations according to the Electrical Breakdown Strength Test Method. The test results are shown in Table 2.

Comparative Example 7 (CE7): melt compound polyethylene polymer (A)-1 with a known amount of (B)-1, 4-methoxyphenol, and a known amount of (C)-1, benzophenone to give comparative polyolefin formulation CE7, wherein the amount of (B)-1 in wt % in the formulation is greater than one-half the amount of (C)-1 in wt % in the formulation, i.e., wherein the relative amounts of (B)-1 and (C)-1 violate the "proviso that x is less than 0.5y". Test the formulation according to the Electrical Breakdown Strength Test Method. The test result is shown in Table 2.

TABLE 1 compositions of formulations CE0 to CE7. (0 = 0.00)

| Constituent (wt %) | CE0 | CE1 | CE2 | CE3 | CE4 | CE5 | CE6 | CE7 |
|---|---|---|---|---|---|---|---|---|
| Polyethylene Polymer (A)- 1 (LDPE-1) | 100 | 99.5 | 98.0 | 99.5 | 99.5 | 98.0 | 93.0 | 97.6 |
| 4-methoxyphenol (B)-1 | 0 | 0.5 | 2.0 | 0 | 0 | 0 | 0 | 2.0 |
| 4-heptyloxyphenol (B)-2 | 0 | 0 | 0 | 0.5 | 0 | 0 | 0 | 0 |
| benzophenone (C)-1 | 0 | 0 | 0 | 0 | 0.5 | 2.0 | 7.0 | 0.4 |
| Total | 100 | 100 | 100 | 100 | 100 | 100 | 100 | 100 |

TABLE 2 electrical breakdown strength test results of formulations CE0 to CE6.

| Electrical Breakdown Strength | CE0 | CE1 | CE2 | CE3 | CE4 | CE5 | CE6 | CE7 |
|---|---|---|---|---|---|---|---|---|
| voltage stabilizer/destabilizer | No | (B)-1 | (B)-1 | (B)-2 | (C)-1 | (C)-1 | (C)-1 | (B)-1 + (C)-1 |
| Total Concentration of comparative voltage stabilizer/ destabilizer (wt %) | 0 | 0.5 | 2.0 | 0.5 | 0.5 | 2.0 | 7.0 | 2.4 |
| Percentage increase in voltage (improvement, +%) or percentage decrease in voltage (degradation, −%) relative to voltage of CE0 | 0% | 2.6 | 0.26 | N/m | 17, 19 | 29 | 25 | 13 |

N/m=not measured.

N/r is not reported. As indicated by the data in Table 2, relative to CE0, which does not contain an additive that is a voltage stabilizer, 2.0 wt % of benzophenone enhances voltage breakdown strength by 29% (CE5). The 2.4 wt % of a 2.0/0.4 (wt/wt) combination of 4-methoxyphenol and benzophenone, i.e., a combination of 2.0 wt % of (B) and 0.4 wt % of (C) that does not satisfy the proviso x is less than 0.5y, decreases voltage breakdown strength (CE7) relative to the sum of the improvements of CE2+CE4 (=17.26% to 19.26%).

Inventive Examples 1 to 3 (IE1 to IE3): In separate runs, melt compound polyethylene polymer (A)-1 with known amounts of the 4-methoxyphenol (B)-1 and benzophenone (C)-1 or melt compound polyethylene polymer (A)-1 with known amounts of the 4-heptyloxyphenol (B)-2 and benzophenone (C)-1 according to Table 3 below to give inventive polyolefin formulations of IE1 to IE3. Test the formulations according to the Electrical Breakdown Strength Test Method. The test results are shown in Table 4.

Inventive Example 4 (IE4): Prophetic. In separate run, melt compound polyethylene polymer (A)-1 with known amounts of the 4-methoxyphenol (B)-1, 4-heptyloxyphenol (B)-2, and benzophenone (C)-1 according to Table 3 below to give inventive polyolefin formulation of IE4. Test the formulation according to the Electrical Breakdown Strength Test Method.

TABLE 3 compositions of formulations CE0, IE1 to IE3. (0 = 0.00)

| Constituent (weight parts) | CE0 | IE1 | IE2 | IE3 | IE4 (prophetic) |
|---|---|---|---|---|---|
| Polyethylene Polymer (A)-1 (LDPE-1) | 100 | 92.6 | 97.6 | 97.6 | 98.6 |
| 4-methoxyphenol (B)-1 | 0 | 0.4 | 0.4 | 0 | 0.2 |
| 4-heptyloxyphenol (B)-2 | 0 | 0 | 0 | 0.4 | 0.2 |
| benzophenone (C)-1 | 0 | 7.0 | 2.0 | 2.0 | 2.0 |
| Total | 100 | 100 | 100 | 100 | 100 |

The data in Table 3 indicates that the polyolefin formulations of IE1 to IE4 are examples of the inventive polyolefin formulation.

TABLE 4 electrical breakdown strength test results of formulations CE0, IE1 to IE3.

| Electrical Breakdown Strength | CE0 | IE1 | IE2 | IE3 | IE4 (Prophetic) |
|---|---|---|---|---|---|
| voltage stabilizer/destabilizer | None | (B)-1 + (C)-1 | (B)-1 + (C)-1 | (B)-2 + (C)-1 | (B)-1 + (B)-2 + (C)-1 |
| Total Concentration of comparative voltage stabilizer/destabilizer (wt %) | 0 | 7.4 | 2.4 | 2.4 | 2.4 |
| Percentage increase in voltage (improvement, +%) or percentage decrease in voltage (degradation, −%) relative to voltage of CE0 | 0% | +39% | +38% | +46% | Expect about 42% |

As indicated by the data in Table 4, relative to CE0, which does not contain an additive that is a voltage stabilizer, a combination of 0.4 wt % of 4-methoxyphenol (B)-1 and 2.0 wt % of benzophenone (C)-1 yields an improvement in voltage breakdown strength of 38%. As shown in Table 2, 0.5 wt % of 4-methoxyphenol (B)-1 alone gives an improvement of only 2.6% (CE1) and 2.0 wt % of benzophenone (C)-1 alone gives an improvement of only 29% (CE5), for a total comparative improvement of CE1+CE5=31.6%. A combination of 0.4 wt % of 4-methoxyphenol (B)-1 and 7.0 wt % of benzophenone (C)-1 yields an improvement in voltage breakdown strength of 39%. As shown in Table 2, 0.5 wt % of 4-methoxyphenol (B)-1 alone gives an improvement of only 2.6% (CE1) and 7.0 wt % of benzophenone (C)-1 alone gives an improvement of only 25% (CE6), for a total comparative improvement for CE1+CE6=27.6%. Thus, the voltage stabilizing improvement of the inventive polyolefin formulation comprising the (A) polyolefin polymer; the (B) 4-alkoxyphenol compound of formula (I) wherein $R^1$ is (C1-C20)alkyl; and the (C) benzophenone compound of formula (II) can be said to be synergistic.

As indicated by the data in Table 4, the 0.4 wt % of 4-heptyloxyphenol (B)-2 in combination with 2.0 wt % of the (C)-1 benzophenone in IE3 performs better than the 0.4 wt % of 4-methoxyphenol (B)-1 in combination with the same 2.0 wt % of the (C)-1 benzophenone of IE1.

Inventive Examples 5a to 5c, 6a to 6c, 7a to 7c, and 8a to 8c (IE5a to IE5c, IE6a to IE6c, IE7a to IE7c, and IE8a to IE8c, all prophetic): in separate runs replicate Inventive Example IE1 except replace the polyethylene polymer (A)-1 with a high-density polyethylene polymer (HDPE, IE5a to IE5c), an ethylene/vinyl acetate copolymer (EVA, IE6a to IE6c), an ethylene/methyl acrylate copolymer (EMA, IE7a to IE7c), or an ethylene/(monocyclic tetravinyl-tetramethyl-tetrasiloxane) copolymer) (IE8a to IE8c) to give a first inventive polyolefin formulation IE5a, IE6a, IE7a, or IE8a, respectively. In separate runs soak 1.0 wt % dicumyl peroxide thereinto to give a second inventive polyolefin formulation of IE3b, IE4b, IE5b, or IE6b, respectively. Wt % are based on total weight of the respective second formulation. In separate runs heat the resulting inventive formulation IE5b, IE6b, IE7b, or IE8b at 120° C. for 1 hour, thereby making an inventive crosslinked polyolefin product of IE5c, IE6c, IE7c, or IE8c.

Inventive Example 9 (prophetic): making a coated conductor. The inventive polyolefin formulation of any one of the foregoing inventive examples is introduced into a wire coating extrusion line to make a coated wire of having a coating consisting essentially of the formulation as wire constructions on 14 AWG solid copper wire. The wire coating extrusion line consists of a BRABENDER 1.9 cm extruder with variable speed drive, a 25:1 standard PE screw, a BRABENDER cross-head wire die, lab water cooling trough with air wipe, a laser micrometer and a variable speed wire puller. The sample is extruded at 40 rpm screw speed with 0.76 millimeter (mm, 30 mils) wall thickness. A wire is made using a set temperature profile of 160°/170°C./180° C./190° C. across zone 1/zone 2/zone 3/and head/die, respectively, at a take-up speed of 3.1 meters per minute (10 feet per minute). The coating on the wire consists essentially of one of the inventive polyolefin formulations. The wire may be passed through a vulcanization tube set at a cure temperature of 220° C. to fully cure the formulation to give a wire having a coating thereon wherein the coating consists essentially of an inventive crosslinked product thereof.

Inventive Example 10 (prophetic): conducting electricity. Strip end portions of the coating from each end of the coated wire made above to expose the wire. Apply a voltage across the wire (e.g., conductive core) of the coated wire (coated conductor), thereby generating a flow of electricity through the wire. The applied voltage may be sourced from a battery, an electrical power grid, or an inverter-containing solar panel.

The invention claimed is:

1. A polyolefin formulation comprising (A) a polyolefin polymer; x weight percent (wt %) of (B) an alkoxyphenol compound of formula (I):

(I)

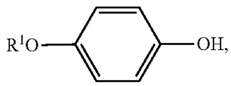

wherein R1 is a (C1-C20) alkyl; and y wt % of (C) a benzophenone compound of formula (II):

(II)

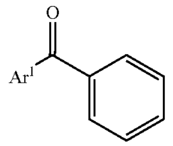

, wherein Ar1 is phenyl or an alkylphenyl; wherein y is from 1 to 8 wt %; wherein x is from 0.1 to 3.0 wt %, with the proviso that x is less than 0.5y; and wherein wt % are based on total weight of the polyolefin formulation.

2. The polyolefin formulation of claim 1 wherein the Ar1 is phenyl; and R1 is selected from the group consisting of: (i) (C1-C5)alkyl; (ii) (C6-C10alkyl; (iii) methyl; and (iv) heptyl; or wherein the Ar1 is an alkylphenyl; and R1 is selected from the group consisting of: (i) (C1-C5)alkyl; (ii) (C6-C10)alkyl; (iii) methyl; and (iv) heptyl.

3. The polyolefin formulation of claim 2 wherein the R1 is methyl or heptyl and the Ar1 is phenyl.

4. The polyolefin formulation of claim 1 wherein the (A) polyolefin polymer is selected from the group consisting of: a low-density polyethylene polymer, an ethylene/(C4-C20) alpha-olefin copolymer, an ethylene/(unsaturated carboxylic ester) copolymer, an ethylene/(monocyclic organosiloxane) copolymer, an ethylene/propylene copolymer, an ethylene/propylene/(diene monomer) terpolymer, and a propylene homopolymer.

5. The polyolefin formulation of claim 1 comprising from 50.0 to 99.7 weight percent (wt %) of the (A) polyolefin polymer; from x=0.2 wt % to x=0.9 wt % of the (B) alkoxyphenol compound; from 1.6 to 7.4 wt % of the (C) benzophenone compound; and a total of from 0.1 to 43 wt % of at least one additive, wherein each of the at least one additive is different than constituents (A), (B), and (C) and is independently selected from the group consisting of: (D) an organic peroxide; (E) an anti-scorch agent; (F) an antioxidant; (G) a filler; (H) a flame retardant; (I) a hindered amine stabilizer; (J) a tree retardant; (K) a methyl radical scavenger; (L) a crosslinking coagent; (M) a processing aid; (N) a colorant; and a combination of any two or more of additives (D) to (N).

6. The polyolefin formulation of claim 5 comprising from 85 to 99.5 weight percent (wt %) of the (A) polyolefin polymer, which is a low-density polyethylene polymer; from 0.30 to 0.50 wt % of the (B) alkoxyphenol compound that is a compound of formula (I) wherein R1 is methyl or heptyl; from 1.5 to 2.4 wt % of the (C) benzophenone compound of formula (II) wherein Ar1 is phenyl; and from 0.1 to 1.5 wt % of at least one (F) antioxidant.

7. A method of making the polyolefin formulation of claim 1, the method comprising mixing the (A) polyolefin polymer with the (B) alkoxyphenol compound and the (C) benzophenone compound, and, optionally, at least one additive, in such a way so as to make the formulation.

8. A method of making a crosslinked polyolefin product, the method comprising subjecting the polyolefin formulation of claim 1 to a curing condition in such a way so as to crosslink the (A) polyolefin polymer, thereby making the crosslinked polyolefin product.

9. A crosslinked polyolefin product made by the method of claim 8.

10. An article comprising the polyolefin formulation of, the crosslinked polyolefin product of claim 9.

11. A method of transmitting electricity, the method comprising applying a voltage across the conductive core of the coated conductor of claim 10 so as to generate a flow of electricity through the conductive core.

12. A coated conductor comprising a conductive core and an insulation layer at least partially covering the conductive core, wherein the insulation layer comprises the crosslinked polyolefin product of claim 9.

* * * * *